United States Patent
Oda

(10) Patent No.: US 7,217,910 B2
(45) Date of Patent: May 15, 2007

(54) SOLID-STATE IMAGE PICKUP DEVICE

(75) Inventor: Kazuya Oda, Saitama (JP)

(73) Assignee: Fujifilm Corporation, Tokyo (JP)

( * ) Notice: Subject to any disclaimer, the term of this patent is extended or adjusted under 35 U.S.C. 154(b) by 187 days.

(21) Appl. No.: 11/123,179

(22) Filed: May 6, 2005

(65) Prior Publication Data
US 2005/0253045 A1 Nov. 17, 2005

(30) Foreign Application Priority Data
May 7, 2004 (JP) ............ P.2004-138257
Jan. 26, 2005 (JP) ............ P.2005-018191

(51) Int. Cl.
*H01L 27/146* (2006.01)
*H01L 31/042* (2006.01)

(52) U.S. Cl. ............... 250/208.1; 250/370.08; 348/315

(58) Field of Classification Search ........... 250/208.1, 250/370.08; 348/207.99, 294, 311, 315
See application file for complete search history.

(56) References Cited

U.S. PATENT DOCUMENTS 6,690,049 B2 * 2/2004 Suzuki et al. ............. 257/294
6,831,692 B1 * 12/2004 Oda .......................... 348/315
2004/0089788 A1 * 5/2004 Oda et al. ................ 250/208.1
2005/0161714 A1 * 7/2005 Kobayashi ................ 257/294

FOREIGN PATENT DOCUMENTS

JP 10-74926 3/1998
JP 2005216994 A * 8/2005

* cited by examiner

*Primary Examiner*—David Porta
*Assistant Examiner*—David S Baker
(74) *Attorney, Agent, or Firm*—McGinn IP Law Group, PLLC

(57) ABSTRACT

A solid-state image pickup device comprises first and second photoelectric conversion regions, wherein each of first ones of the second photoelectric conversion regions in a peripheral area comprises a first opening having a size larger than that of a second opening of each of second ones of the same in a central area, a first ratio of a length of each of the first ones of the same in a first direction with respect to its opening center to a length of each of the second ones of the same in the first direction is larger than a second ratio of a length of each of the first ones of the same in a second direction to a length of each of the second ones of the same in the second direction; and the first direction is a direction, in a plan view, in which light coming in the second photoelectric conversion regions is cut off in the highest degree.

4 Claims, 5 Drawing Sheets

SOLID-STATE IMAGE PICKUP DEVICE

BACKGROUND OF THE INVENTION

1. Field of the Invention

This invention relates to a solid-state image pickup device with a plurality of photoelectric conversion regions arranged on a semiconductor substrate.

2. Description of the Related Art

A previously known digital camera uses a solid-state image pickup device including a plurality of first photoelectric conversion regions arranged in a row direction and a column direction orthogonal thereto on a semiconductor substrate and a plurality of micro-lenses located on the respective plurality of first photoelectric conversion lenses. In such a solid-state image pickup device, a plurality of second photoelectric conversion regions are arranged between the adjacent micro-lenses to synthesize image pickup signals from the first photoelectric conversion regions and those from the second photoelectric conversion regions, thereby extending the dynamic range of the digital camera (JP-A-10-74926).

In the solid-state image pickup device as disclosed in JP-A-10-74926, on the periphery, light obliquely comes so that shading occurs. In order to avoid the shading, conventionally, the size of each the photoelectric conversion regions is made larger at a farther distance from the center of the solid-state image pickup device, thereby reducing the shading. This measure for dealing with the shading intends to reduce the shading which is attributable to the optical system of the digital camera incorporating the solid-state image pickup device.

In the solid-state image pick-up device, since the plurality of photoelectric conversion regions are arranged at a high density on the semiconductor substrate, the interval between the micro-lenses corresponding to the plurality of photoelectric conversion regions is also very narrow. In the technique disclosed in JP-A-10-74926, the second photoelectric conversion regions are arranged between the adjacent micro-lenses. However, since the interval between the micro-lenses is very narrow, in addition to the above shading attributable to the optical system, the shading attributable to the micro-lenses will occur. Thus, with only the conventional measure for dealing with the shading, the shading cannot be sufficiently reduced. The shading which is attributable to the micro-lenses will be explained below.

FIG. 6 is a view showing a schematic section of the solid-state image pickup device disclosed in JP-A-10-74926. As seen from FIG. 6A, light beams a entering vertically from above the conventional solid-state image pick-up device come in each of micro-lenses 501, and pass through an opening plane 502 so that the light beams a are condensed by a first photodiode (PD) 503. The charges thus accumulated are transferred by a first vertical transfer unit 504. Further the light beams a pass through the opening plane 505 to enter a second PD 506 located between the micro-lenses 501. The charged thus accumulated are transferred by a second vertical transfer unit 507.

As seen from FIG. 6B, light beams b entering obliquely to the direction of arranging two micro-lenses 501, which sandwiches the second PD 506, from above the conventional solid-state image pick-up device come in each of micro-lenses 501, and pass through the opening plane 502 so that the light beams a are condensed by the first photodiode (PD) 503. The charges thus accumulated are transferred by a first vertical transfer unit 504. Further the light beams b pass through the opening plane 505 to enter the second PD 506. However a part of light beams b (arrow indicated by dotted line) cannot pass through the opening plane 505. This is true of the light beams c which come in symmetrically to the light beams b. On the other hand, most of the light beams entering in the direction of the second PD not sandwiched by the micro-lenses 501 (direction orthogonal to the direction indicated by arrow X) come in the second PD 506 because of absence of hindrance such as the micro-lenses.

As described above, where a PD is arranged in a narrow region between the two adjacent micro-lenses 501, the light beams b and c entering obliquely to the direction of the second PD 507 sandwiched by the micro-lenses 501 are concealed in their larger part by the shade of the micro-lens 501 so that a large quantity of light beams cannot pass through the opening plane 505. On the other hand, most of the light beams from the direction of the second PD 506 not sandwiched by the micro-lenses 501 comes in the second PD 506. As a result, the image pickup device is light in the direction of the second PD not sandwiched by the micro-lenses 501 and dark in the direction (X direction) of arranging the two micro-lenses 501 which sandwich the second PD 506, thus increasing the shading.

Thus, even if the conventional measure for dealing with the shading is performed, the signals produced from the second PDs 506 on the periphery of the solid-state image pick-up device are accompanied by the shading attributable to the micro-lenses. As regards the second PDs 506 on the periphery of the solid-state image pickup device, the measure for dealing with the shading is required for reducing both shading attributable to the optical system and shading attributable to the micro-lenses.

SUMMARY OF THE INVENTION

This invention has been accomplished in view of the circumstances described above. An object of this invention is to provide a solid-state image pickup device capable of reducing shading.

According to the invention, there is provided a solid-state image pickup device comprising: a semiconductor substrate; a plurality of photoelectric conversion regions arranged on the semiconductor substrate, comprising: a plurality of first photoelectric conversion regions arranged in a row direction and a column direction orthogonal thereto on the semiconductor substrate; and a plurality of second photoelectric conversion regions arranged in the row direction and the column direction on the semiconductor substrate; and micro-lenses each of which overlies each of said plurality of first photoelectric conversion regions, wherein each of said plurality of second photoelectric conversion regions is located below a location between adjacent ones of the micro-lenses, each of first ones of the second photoelectric conversion regions in a peripheral area of a region in which said plurality of photoelectric conversion regions are arranged comprises a first opening having a size larger than that of a second opening of each of second ones of the second photoelectric conversion regions in a central area of the region in which said plurality of photoelectric conversion regions are arranged, a first ratio of (a) a length of each of the first ones of the second photoelectric conversion regions in a first direction with respect to its opening center to (b) a length of each of the second ones of the second photoelectric conversion regions in the first direction with respect to its opening center is larger than a second ratio of (c) a length of each of the first ones of the second photoelectric conversion regions in a second direction other than the first direction with respect to its opening center to (d) a length of each of the second ones of the second photoelectric conversion regions in the second direction with respect to its opening center; and among incidence directions of light coming in the second photoelectric conversion regions in a plan view of the semiconductor substrate, the first direction is a direction in which the light is cut off in the highest degree.

This configuration provides a solid-state image pickup device capable of reducing shading.

Further, in the solid-state image pickup device according to this invention, the lengths of each of the first ones of the second photoelectric conversion regions in the first direction and in the second direction with respect to the opening center are larger at a farther distance from the central area.

This configuration effectively reduces shading.

Further, in the solid-state image pickup device according to this invention, said plurality of photoelectric conversion regions are arranged to make a square lattice pattern; and the first photoelectric conversion regions and the second photoelectric conversion regions are arranged to make a checkered pattern, respectively.

The solid-state image pickup device according to this invention further comprises a plurality of optical waveguides each of which introduces light into each of the second photoelectric conversion regions, wherein the opening of each of the second photoelectric conversion regions is an opening of each of the optical waveguides.

DETAILED DESCRIPTION OF THE INVENTION

Figure 1:
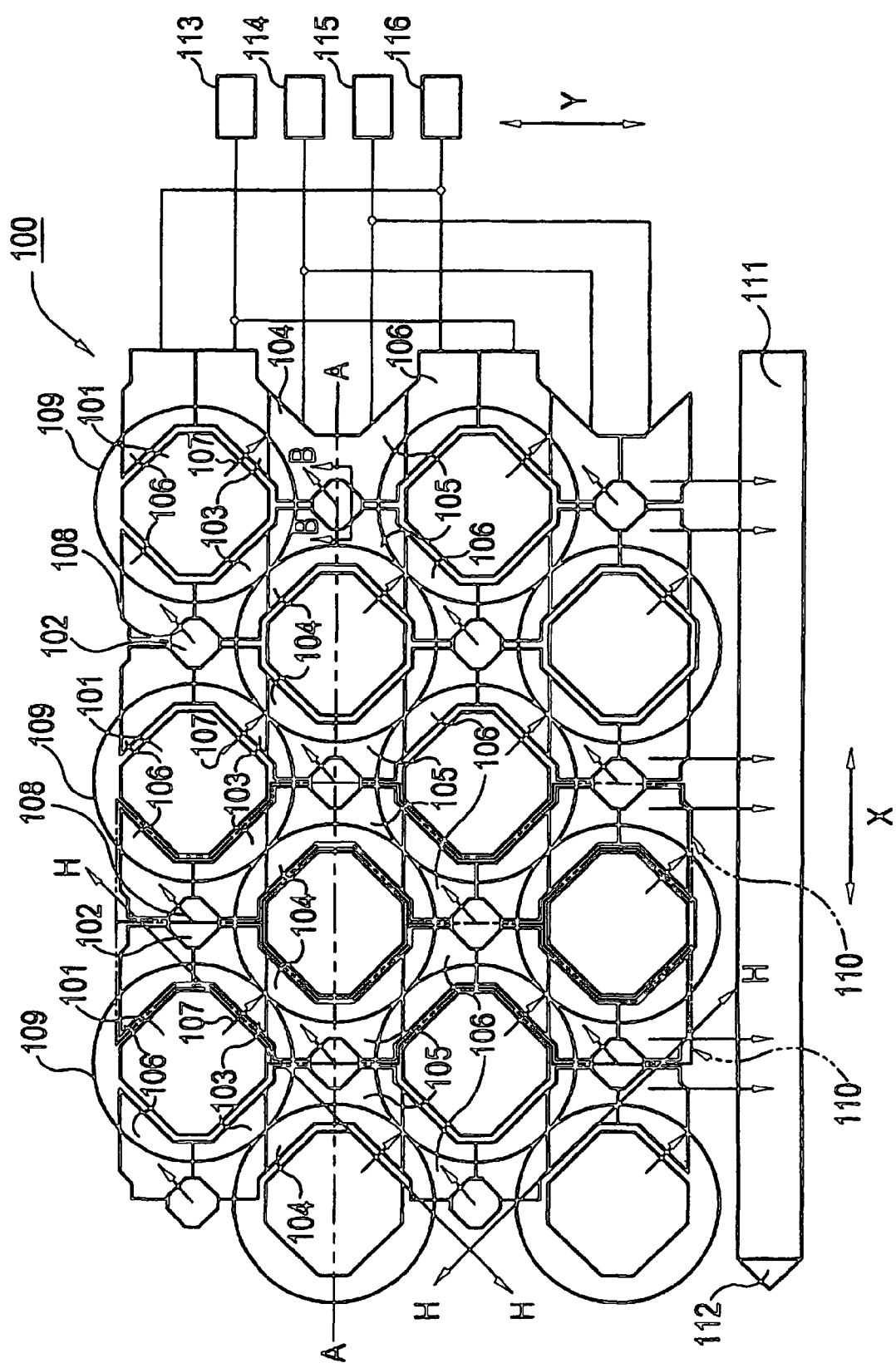
FIG. 1 is a view showing the schematic configuration of a solid-state image pickup device for explaining an embodiment of this invention.

FIG. 1 is a view showing the schematic configuration of a solid-state image pickup device for explaining an embodiment of this invention. In FIG. 1, a solid-state image pickup device 100 is illustrated in partial enlargement.

The solid-state image pickup device 100 includes a plurality of photoelectric conversion regions (a plurality of first photoelectric conversion regions 101 and a plurality of second conversion regions 102) arranged in a square lattice pattern on a semiconductor substrate surface in a row direction (X direction in FIG. 1) and a column direction orthogonal thereto (Y direction in FIG. 1); a plurality of vertical transfer units 110 (in FIG. 1, only part thereof are marked with reference numerals) arranged so as to correspond to a plurality of columns of photoelectric conversion regions, respectively, each column consisting of the plurality of photoelectric conversion regions arranged in the column direction, the vertical transfer units for transferring charges from the plurality of photoelectric conversion regions in the column direction; a horizontal transfer unit 111 for transferring charges transferred by the vertical transfer units 110 in the row direction; and an output unit 112 for outputting a signal corresponding to the charge transferred by the horizontal transfer unit 111. On the plurality of first photoelectric conversion regions 101, a plurality of micro-lenses 109 covering them are formed, respectively. The first photoelectric conversion regions 101 and the second photoelectric conversion regions 102 are formed of e.g. photodiodes (PDs). Incidentally, it should be noted that the first photoelectric conversion regions 101 and second photoelectric conversion regions 102 in FIG. 1 are illustrated in only the areas seen from the openings of the first photoelectric conversion regions 101 and second photoelectric conversion regions 102.

The first photoelectric conversion regions 101, which carry out photoelectric conversion with relatively high sensitivity for the quantity of incident light on the solid-state image pickup device 100, are arranged to make a checkered pattern. The second photoelectric conversion regions 102, which carry out photoelectric conversion with relatively low sensitivity for the quantity of incident light on the solid-state image pickup device 100, are likewise arranged to make the checkered pattern. The second photoelectric conversion regions 102 are located between the micro-lenses 109 covering the adjacent first photoelectric conversion regions 101. The openings of the first photoelectric conversion regions 101 and the second photoelectric conversion regions 102 are formed in an octagonal shape, respectively. The sensitivity of the first photoelectric conversion regions 101 and second photoelectric conversion regions 102 may be varied by changing the area of the light receiving surface (opening area) of each of the photoelectric conversion regions, or by changing a light gathering area using the macro-lenses formed on the photoelectric conversion regions. These techniques, which are well known, will not be explained here.

Figure 3:
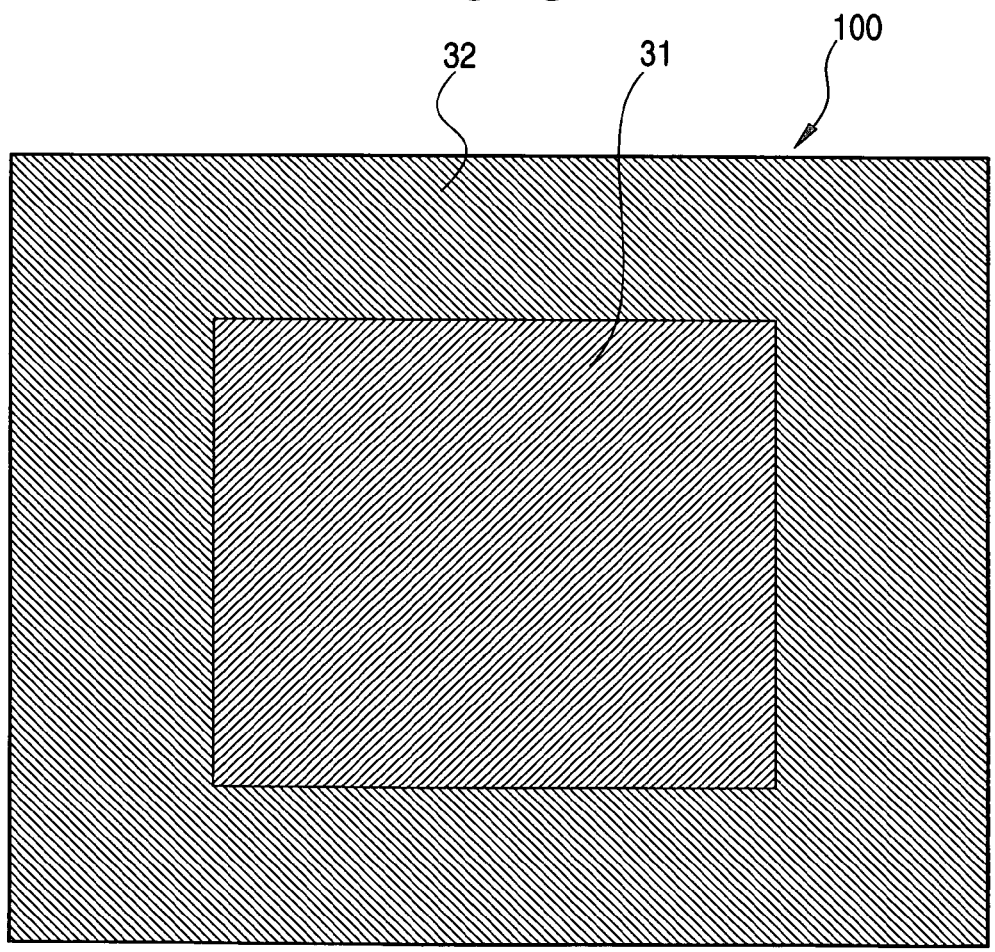
FIG. 3 is a view for explaining the central area and peripheral area of the solid-state image pickup device according to an embodiment of this invention.

The vertical transfer units 110 include a plurality of vertical transfer channels (not shown) arranged in the column direction on the semiconductor substrate so as to correspond to a plurality of columns of photoelectric conversion regions arranged in the column direction, respectively; a plurality of vertical transfer electrodes 103 to 106 (in FIG. 1, only part thereof are marked with reference numerals) formed to overlie the vertical transfer channels; and first charge reading regions 107 and second charge reading regions 108 (in FIG. 3, they are schematically illustrated in arrows). The plurality of vertical transfer electrodes 103 to 106 make a meandering pattern, respectively wholly extending in the row direction between the first photoelectric conversion regions 101 and the second photoelectric conversion regions 102.

The vertical transfer channels are regions having the meandering pattern wholly extending in the column direction between the photoelectric conversion regions. By the vertical transfer electrodes 103 to 106 formed to overlie the vertical transfer channels, charges are accumulated and the regions to be transferred are sectioned. Two sets of vertical transfer electrodes 103 to 106 are provided to correspond to the first photoelectric conversion regions 101 and the second photoelectric conversion regions 102. To the vertical transfer electrodes 103 to 106, four-phase vertical transfer pulses (hereinafter referred to as driving pulses) applied through terminals 113 to 116 so that the charges in the vertical transfer channels are transferred in the column direction.

The first charge reading regions 107 each is located at the position corresponding to the vertical transfer electrodes 103 and 105. The second charge reading regions 108 each is located at the position corresponding to the vertical transfer electrode 104 and 106. The reading of charges from the first photoelectric conversion regions 101 to the vertical transfer channels is done by superposing a read pulse on the first phase vertical transfer pulse applied to the terminal 113 and third phase vertical transfer pulse applied to the terminal 115. The reading of charges from the second photoelectric conversion regions 102 to the vertical transfer channels is done by superposing the read pulse on the second phase vertical transfer pulse applied to the terminal 114 and fourth phase vertical transfer pulse applied to the terminal 116.

Figure 2:
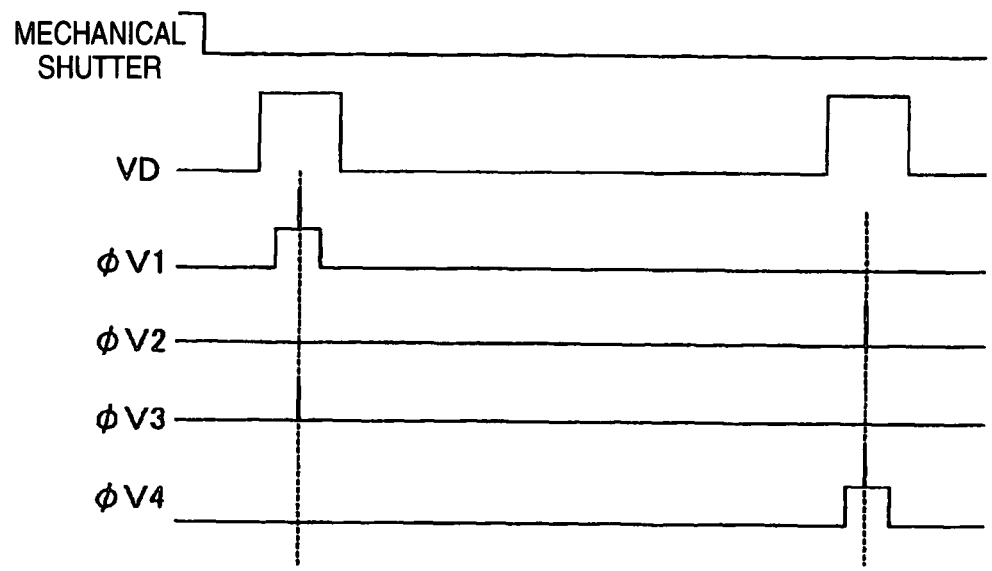
FIG. 2 is a timing chart for explaining the method for driving the solid-state image pickup device.

FIG. 2 is a timing chart for explaining the method for driving the solid-state image pickup device 100. FIG. 2 shows the timings in the case where the digital camera incorporating the solid-state image pickup device 100 has a mechanical shutter. FIG. 2 shows a vertical synchronous signal VD, open/close state of the mechanical shutter, driving pulse φV1 applied to the terminal 113, driving pulse φV2 applied to the terminal 114, driving pulse φV3 applied to the terminal 115 and driving pulse φV4 applied to the terminal 116.

As seen from FIG. 2, during the closing period of the mechanical shutter, the driving pulse φV1 with the read pulse superposed thereon is applied to the terminal 113 and the driving pulse φV3 with the read pulse superposed thereon is applied to the terminal 115 so that these pulses are synchronous with the vertical synchronous signal VD. Thus, the charges from the first charge reading regions 107 are read to the vertical transfer channels. Further, by repeatedly applying the driving pulses to the terminals 113 to 116, the charges thus read are transferred in the column direction. From the horizontal transfer unit 111, the charges read out from the first photoelectric conversion regions 101 corresponding to one row (line) are transferred to the output unit 112 as occasion demands.

The driving pulse φV2 with the read pulse superposed thereon is applied to the terminal 114 and the driving pulse φV4 with the read pulse superposed thereon is applied to the terminal 116 so that these pulses are synchronous with the next vertical synchronous signal VD. Thus, the charges from the second charge reading regions 108 are read to the vertical transfer channels. Further, by repeatedly applying the driving pulses to the terminals 113 to 116, the charges thus read are transferred in the column direction. From the horizontal transfer unit 111, the charges read out from the first photoelectric conversion regions 101 corresponding to one row (line) are transferred to the output unit 112 as occasion demands.

In this way, in accordance with the solid-state image pickup device 100, the charges from the first photoelectric conversion regions 101 and the charges from the second photoelectric conversion regions 102 can be read out independently.

Next, the shape of the opening of the second photoelectric conversion regions 102 will be explained below.

FIG. 3 is a view for explaining the central area and peripheral area of the solid-state image pickup device according to this invention.

As seen from FIG. 3, the area where the plurality of photoelectric conversion regions of the solid-state image pickup device 100 are arranged includes the central area 31 and the peripheral area 32. In the central area 31, the incident angle of the light coming in the solid-state image pickup device 100 is substantially perpendicular to the semiconductor substrate. In the peripheral area 32, the incident angle of the light coming in the solid-state image pickup device 100 is oblique to the semiconductor substrate so that the shading may be increased.

In the solid-state image pickup device 100, the size of the opening of each of the second photoelectric conversion regions 102 in the peripheral area 32 is larger than that of the opening of each of the second photoelectric conversion regions 102 in the central area 31. In addition, the size of the opening of each of the second photoelectric conversion regions 102 in the peripheral area 32 is made larger at a farther distance from the central area 31. Further, the ratio of the length of each of the second photoelectric conversion regions 102 in the peripheral area 32 in a specific direction (first direction) with respect to its opening center to the length of each of the second photoelectric conversion regions 102 in the central area 31 in the specific direction with respect to its opening center is larger than the ratio of the length of each of the second photoelectric conversion regions 102 in the peripheral area 32 in a direction (second direction) other than the specific direction with respect to its opening center to the length of each the second photoelectric conversion regions 102 in the central area 31 in the direction other than the specific direction with respect to its opening center.

Of the incident directions of the light coming in the second photoelectric conversion regions 102 in a plan view, the specific direction (first direction) is the direction in which the light is cut off in the highest degree. Referring to FIG. 1, the direction in which the light coming in the second photoelectric conversion regions 102 are cut off in the highest degree by the micro-lenses 109 is a direction in which the two micro-lenses 109 sandwich the second photoelectric conversion region 102 are arranged, i.e. the X direction and Y direction in FIG. 1. Since the light coming in the second photoelectric conversion regions from the X and Y directions is considerably cut off by the micro-lenses 109, a small amount of light comes in the second photoelectric conversion regions 102.

Of the incident directions of the light coming in the second photoelectric conversion regions 102 in a plan view, for example, the other direction (second direction) than the specific direction is the direction in which the light is cut off in the lowest degree. Referring to FIG. 1, the direction in which the light coming in the second photoelectric conversion regions 102 is cut off in the lowest degree by the micro-lenses 109 is an H direction in FIG. 1. Since the light coming in the second photoelectric conversion regions from the H direction comes in the second photoelectric conversion regions 102 through valleys between the micro-lenses 109, a large amount of light comes in the second photoelectric conversion regions 102.

A concrete explanation will be given of the size of the opening of the second photoelectric conversion region 102.

Figure 4A:
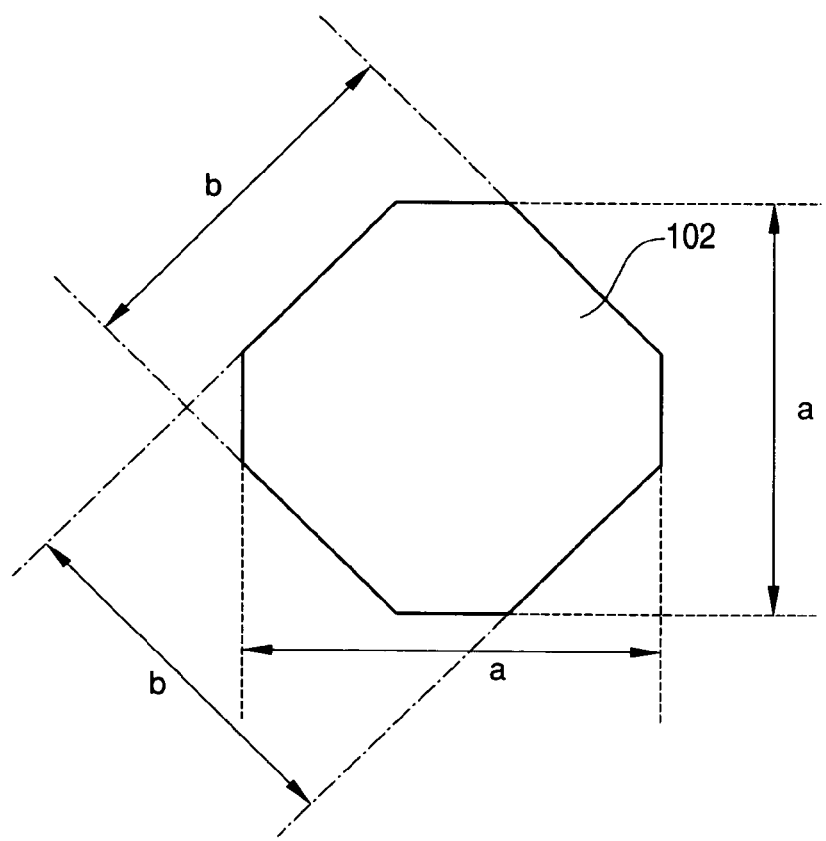
FIG. 4A is a view for explaining the size of the opening of the second photoelectric conversion region in a central area.
Figure 4B:
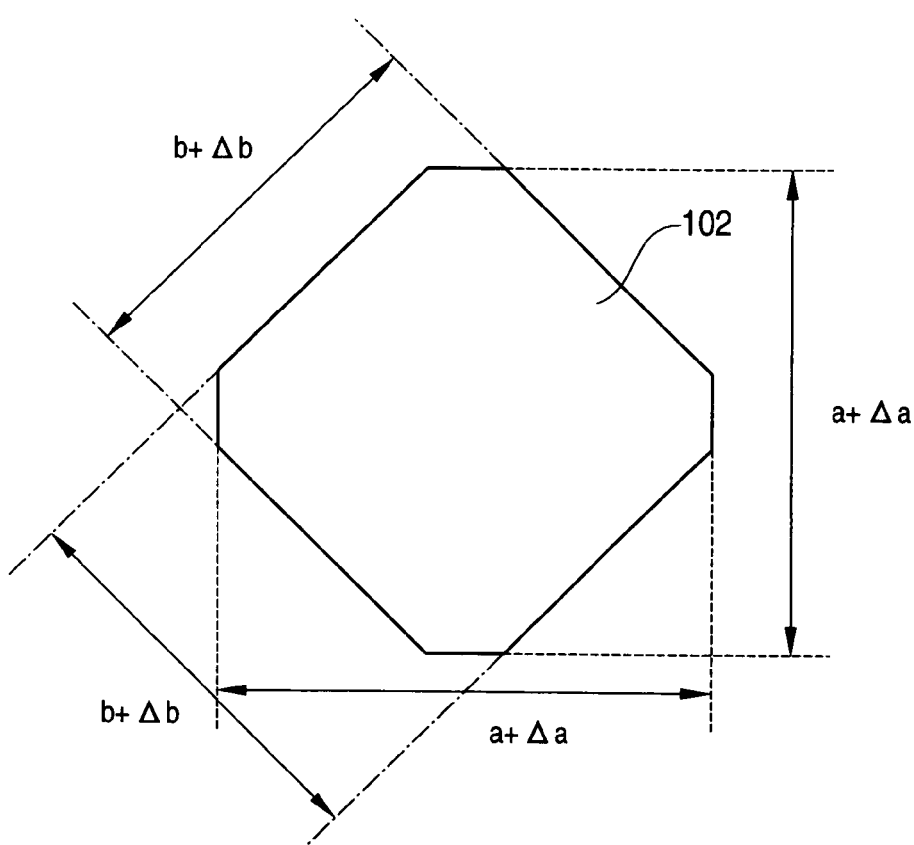
FIG. 4B is a view for explaining the size of the opening of the second photoelectric conversion region in a peripheral area.

FIG. 4 is views for explaining the size of the opening of the second photoelectric conversion region 102. FIG. 4A illustrates the opening of the second photoelectric conversion region 102 in the central area 31. FIG. 4B illustrates the opening of the second photoelectric conversion region 102 in the peripheral area 32.

As seen from FIG. 4A, as regards the second photoelectric conversion region 102 located in the central area 31, the length of its opening in the specific direction (X direction and Y direction in FIG. 1) with respect to the opening center is a . As regards the second photoelectric conversion region 102 located in the central area 31, the length of its opening in the direction (e.g. H direction in FIG. 1) other than the specific direction with respect to the opening center is b.

As seen from FIG. 4B, as regards the second photoelectric conversion region 102 located in the peripheral area 32, the length of its opening in the specific direction (X direction and Y direction in FIG. 1) with respect to the opening center is a +Δa As regards the second photoelectric conversion region 102 located in the peripheral area 32, the length of its opening in the direction (e.g. H direction in FIG. 1) other than the specific direction with respect to the opening center is b +Δb.

In the solid-state image pickup device 100, the ratio of length a +Δa to length a is larger than the ratio of length b +Δb. Δa is defined to be larger than Δb. In addition, Δa and Δb are defined to be larger at a farther distance from the central area 31 of the second photoelectric conversion region 102.

By such definition, at a farther distance from the central area 31 of the solid-state image pickup device 100 toward the peripheral area 32 thereof, the size of the opening of the second photoelectric conversion region 102 is larger. This can suppress the shading on the peripheral area 32 which is attributable to the optical system of the digital camera incorporating the solid-state image pickup device 100.

Further, at a farther distance from the central area 31 of the solid-state image pickup device 100 toward the peripheral area 32 thereof, the lengths of the opening of the second photoelectric conversion region 102 in the X and Y directions and the H direction with respect to the opening center are larger. The increasing rate of the length is larger in the X and Y directions than the H direction. For example, if the increasing rate of the length is equal in the X and Y directions and the H direction, or larger in the H direction than in the X and Y directions, the amount of light coming in the second photoelectric conversion regions is larger in the H direction than in the X and Y directions, i.e. smaller in the X and Y directions than in the H direction. In this case, even if the shading in the peripheral area 32 (shading of the signal obtained from the second photoelectric conversion region 102) attributable to the above optical system can be reduced, the shading in the peripheral area 32 (shading of the signal obtained from the second photoelectric conversion region 102) attributable to the above micro-lens 109 cannot be reduced. In accordance with this embodiment of this invention, of the light coming in the photoelectric conversion regions 102 the difference between the amount of the light coming in the H direction and that of the light coming in the X and Y directions can be reduced, thereby reducing the shading in the peripheral area 32 (shading of the signal obtained from the second photoelectric conversion region 102) attributable to the above micro-lens 109.

Incidentally, in the embodiment described above, as the direction other than the specific direction, the H direction was adopted. However, the above effect can be expected in any other direction as long as the increasing rate of the length in the specific direction is larger than that in the other direction.

Further, in the embodiment described above, the size of the opening of the first photoelectric conversion regions 101 was not mentioned. However, as regards the opening of each the first photoelectric conversion regions 101, by performing the same measure for dealing with the shading as in the prior art, the shading of the signal obtained from the first photoelectric conversion region 101 can be reduced. Thus, the shading of the signals obtained from the first photoelectric conversion region 101 and the second photoelectric conversion region 102 can be reduced, thereby making satisfactory the image data obtained by synthesizing the signal produced from the first photoelectric conversion region 101 and the signal produced from the second photoelectric conversion region 102.

Finally, a detailed explanation will be given of the structure of the opening of the second photoelectric conversion region 102.

Figure 5:
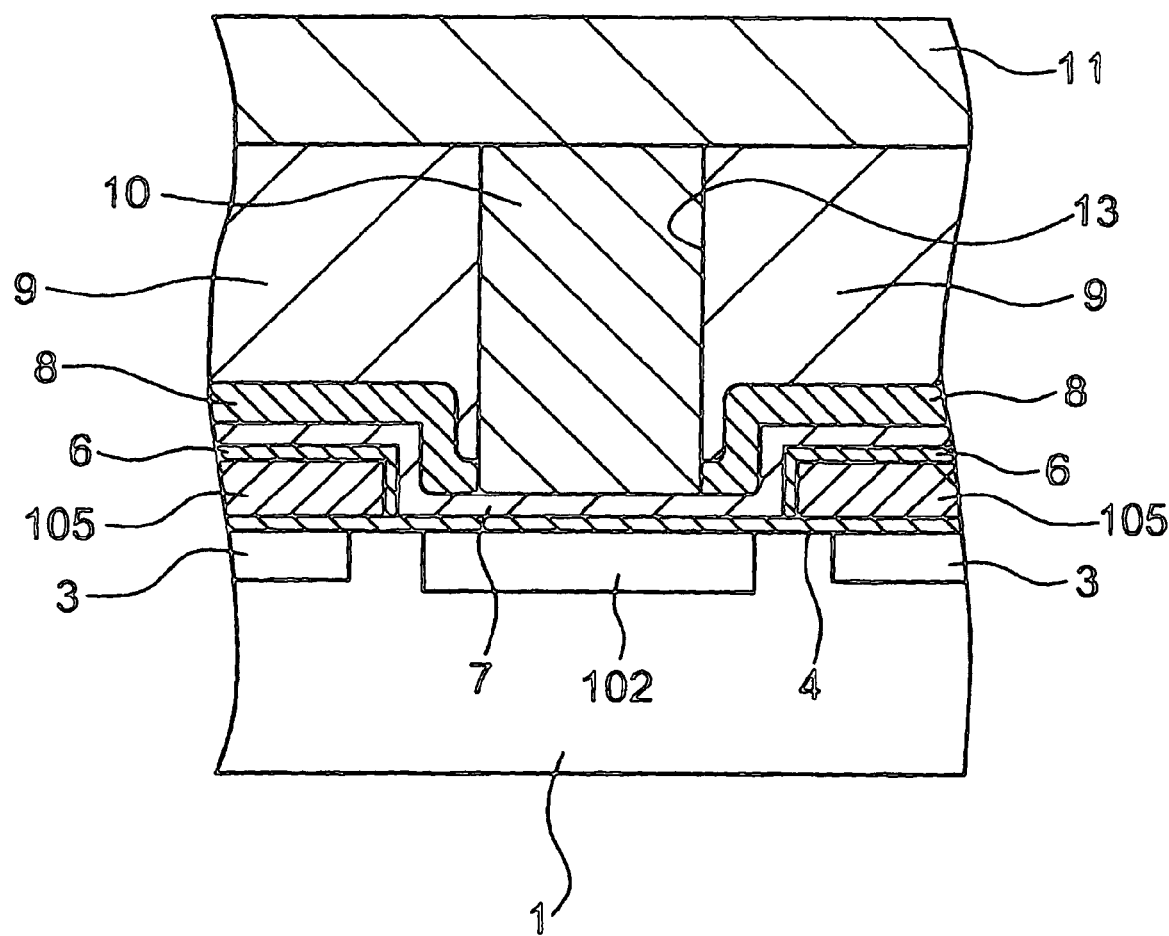
FIG. 5 is a sectional view of the solid-state image pick-up device taken in line B—B in FIG. 1.
Figures 6A, 6B:
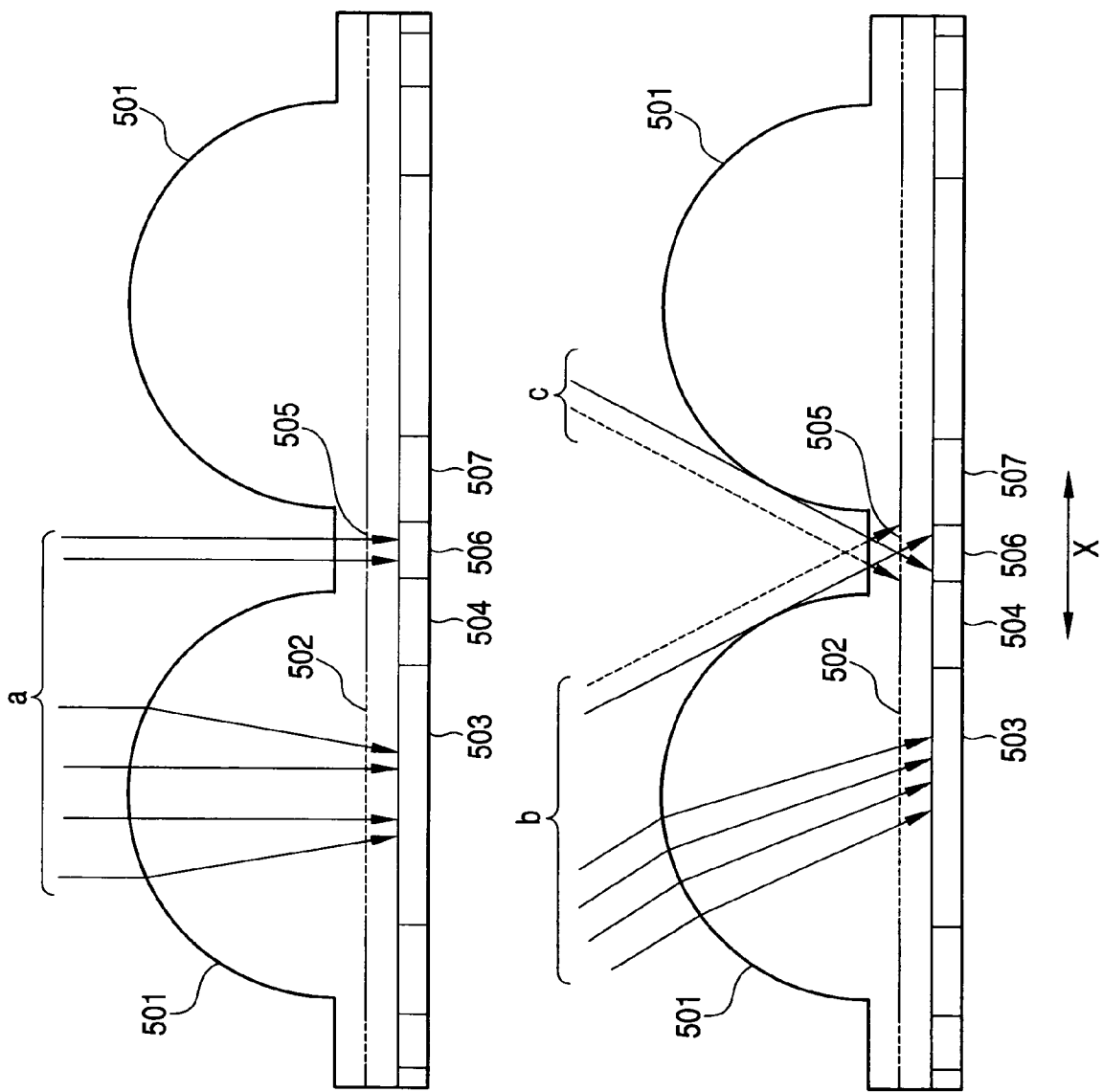
FIGS. 6A and 6B are schematic sectional views of a solid-state image pick-up device disclosed in JP-A-10-74926.

FIG. 5 is a sectional view of the solid-state image pickup device taken in line B—B in FIG. 1. As seen from FIG. 5, the second photoelectric conversion regions 102 and transfer channels 3 are formed in the semiconductor substrate 1. Between the second photoelectric conversion region 102 and the transfer channel 3, a read gate or channel stop region (not shown) is formed. Above the transfer channel 3, the vertical transfer electrode 105 is formed through the gate insulating film 4. A thin insulating film 6 is formed to overlie the vertical transfer electrode 105. An interlayer insulating film 7 is formed to overlie the thin insulating film 6 and extend over the second photoelectric conversion region 102. On the interlayer insulating layer, a light shielding film 8 is formed to prevent the incidence of the light on the vertical transfer electrode 105. The light shielding film 8 is provided with an opening located on the second photoelectric conversion region 102 so that the light beams come in the second photoelectric conversion region 102.

A thick transparent film 9 is formed on the light shielding film 8. This transparent film 9 is made of a $SiO_2$ series material with a low refractive index. The transfer channel 3 and the vertical transfer electrode 105 constitute the vertical transfer unit 110.

In this embodiment, particularly, a hole 13 is formed in the transparent film 9 with the low refractive index at the position immediately above the second photoelectric conversion region 102. The hole 13 is filled with a material with a high refractive index to form an optical waveguide (path through which light is guided to the second photoelectric conversion region 102). The high refractive index material may be a coloring film 10 of organic polymer (organic polymer with the high refractive index, e.g. polyimide resin) doped with the pigment corresponding to the color of the color filter formed above the second photoelectric conversion region 102. The coloring film 10 is embedded in the hole 13 to form the optical waveguide. On the transparent film 9 and coloring film 10, a transparent flattening film 11 is formed to flatten the surface of the solid-state image pickup device.

Incidentally, the above optical waveguide may have a forward-tapered portion as disclosed in JP-A-2004-221532. The forward tapered portion refers to a tapered portion in which the size of the planar shape viewed from the incident direction of the light gradually decreases from the light incident plane of the transparent film 9 toward the second photoelectric conversion region 102.

In this embodiment, the "opening of the second photoelectric conversion region 102" refers to the area determining the range of the light coming in the second photoelectric conversion region 102. In the case of the configuration having no optical waveguide, it is the opening made in the light shielding film 8 shown in FIG. 5. In the case of the configuration having the optical waveguide, it is the portion (defined as the opening of the optical waveguide) of the optical waveguide which abut on the transparent flattening film 11.

In accordance with this invention, there is provided a solid-state image pick-up device capable of reducing shading.

The entire disclosure of each and every foreign patent application from which the benefit of foreign priority has been claimed in the present application is incorporated herein by reference, as if fully set forth.

What is claimed is:

1. A solid-state image pickup device comprising:
a semiconductor substrate;
a plurality of photoelectric conversion regions arranged on the semiconductor substrate, comprising: a plurality of first photoelectric conversion regions arranged in a row direction and a column direction orthogonal thereto on the semiconductor substrate; and a plurality of second photoelectric conversion regions arranged in the row direction and the column direction on the semiconductor substrate; and
micro-lenses each of which overlies each of said plurality of first photoelectric conversion regions,
wherein each of said plurality of second photoelectric conversion regions is located below a location between adjacent ones of the micro-lenses,
each of first ones of the second photoelectric conversion regions in a peripheral area of a region in which said plurality of photoelectric conversion regions are arranged comprises a first opening having a size larger than that of a second opening of each of second ones of the second photoelectric conversion regions in a central area of the region in which said plurality of photoelectric conversion regions are arranged,
a first ratio of (a) a length of each of the first ones of the second photoelectric conversion regions in a first direction with respect to its opening center to (b) a length of each of the second ones of the second photoelectric conversion regions in the first direction with respect to its opening center is larger than a second ratio of (c) a length of each of the first ones of the second photoelectric conversion regions in a second direction other than the first direction with respect to its opening center to (d) a length of each of the second ones of the second photoelectric conversion regions in the second direction with respect to its opening center; and
among incidence directions of light coming in the second photoelectric conversion regions in a plan view of the semiconductor substrate, the first direction is a direction in which the light is cut off in the highest degree.

2. A solid-state image pickup device according to claim 1, wherein the lengths of each of the first ones of the second photoelectric conversion regions in the first direction and in the second direction with respect to the opening center are larger at a farther distance from the central area.

3. A solid-state image pickup device according to claim 1, wherein said plurality of photoelectric conversion regions are arranged to make a square lattice pattern; and
the first photoelectric conversion regions and the second photoelectric conversion regions are arranged to make a checkered pattern, respectively.

4. A solid-state image pickup device according to claim 1, further comprising a plurality of optical waveguides each of which introduces light into each of the second photoelectric conversion regions,
wherein the opening of each of the second photoelectric conversion regions is an opening of each of the optical waveguides.

* * * * *